United States Patent
Lowenthal et al.

(10) Patent No.: US 9,324,692 B2
(45) Date of Patent: Apr. 26, 2016

(54) TRANSPARENT LED LAYER BETWEEN PHOSPHOR LAYER AND LIGHT EXIT SURFACE OF LAMP

(71) Applicant: Nthdegree Technologies Worldwide Inc., Tempe, AZ (US)

(72) Inventors: Mark David Lowenthal, Gilbert, AZ (US); Jeffrey Baldridge, Chandler, AZ (US); Reuben Rettke, Phoenix, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 88 days.

(21) Appl. No.: 14/177,678

(22) Filed: Feb. 11, 2014

(65) Prior Publication Data

US 2014/0231834 A1 Aug. 21, 2014

Related U.S. Application Data

(60) Provisional application No. 61/766,051, filed on Feb. 18, 2013.

(51) Int. Cl.
| | | |
|---|---|---|
| *H01L 25/075* | (2006.01) | |
| *H01L 33/60* | (2010.01) | |
| *H01L 33/50* | (2010.01) | |
| *H01L 33/08* | (2010.01) | |
| *F21K 99/00* | (2010.01) | |

(52) U.S. Cl.
CPC .............. *H01L 25/0753* (2013.01); *F21K 9/56* (2013.01); *H01L 33/50* (2013.01); *H01L 33/507* (2013.01); *H01L 33/60* (2013.01); *H01L 2224/95* (2013.01); *H01L 2924/0002* (2013.01)

(58) Field of Classification Search
CPC ... H01L 25/0753; H01L 25/167; H01L 33/50; H01L 33/507; H01L 33/42; H01L 33/44; H01L 33/505; H01L 33/483; H01L 33/502; H01L 33/60; H01L 27/153–27/156
See application file for complete search history.

(56) References Cited

U.S. PATENT DOCUMENTS

| 6,087,680 | A * | 7/2000 | Gramann | H01L 25/0753 257/91 |
|---|---|---|---|---|
| 2005/0212406 | A1* | 9/2005 | Daniels | F21K 9/00 313/503 |
| 2009/0080215 | A1* | 3/2009 | Anandan | G02B 6/0036 362/606 |
| 2009/0108269 | A1* | 4/2009 | Negley | H01L 27/156 257/88 |
| 2009/0114928 | A1* | 5/2009 | Messere | B32B 17/10 257/88 |
| 2010/0133556 | A1* | 6/2010 | Li | F21K 9/00 257/88 |
| 2011/0180818 | A1* | 7/2011 | Lerman | H01L 25/0753 257/88 |

(Continued)

*Primary Examiner* — Marvin Payen
*Assistant Examiner* — Jeremy Joy
(74) *Attorney, Agent, or Firm* — Patent Law Group LLP; Brian D. Ogonowsky

(57) ABSTRACT

A flexible light sheet lamp includes a thin substrate and an array of printed microscopic vertical LEDs (VLEDs) sandwiched between a transparent first conductor layer and a transparent second conductor layer. The light sheet has a light exit surface. The VLEDs have one surface, facing the light exit surface of the light sheet, covered with a reflective metal. A phosphor layer is provided such that the semi-transparent VLED layer is between the phosphor layer and the light exit surface. A reflector layer is provided such that the phosphor layer is between the reflector layer and the VLED layer. The substrate may form the light exit surface or the light exit surface may be the opposite side of the light sheet. Some VLED light passing through the phosphor layer is reflected by the reflector layer and re-enters the phosphor layer. Therefore, less phosphor is needed to achieve the desired conversion ratio.

18 Claims, 2 Drawing Sheets

(56) References Cited

U.S. PATENT DOCUMENTS

| | | | | |
|---|---|---|---|---|
| 2013/0062633 A1* | 3/2013 | Demuynck | ......... | H01L 25/0753 257/88 |
| 2013/0334559 A1* | 12/2013 | Vdovin | ................. | H01L 33/507 257/98 |
| 2014/0209945 A1* | 7/2014 | Baldridge | ........... | H01L 25/0753 257/91 |

* cited by examiner

US 9,324,692 B2

TRANSPARENT LED LAYER BETWEEN PHOSPHOR LAYER AND LIGHT EXIT SURFACE OF LAMP

CROSS-REFERENCE TO RELATED APPLICATIONS

This application is based on U.S. provisional application Ser. No. 61/766,051, filed Feb. 18, 2013, by Mark David Lowenthal et al., assigned to the present assignee and incorporated herein by reference.

FIELD OF THE INVENTION

This invention relates to forming a wavelength-converted light emitting diode (LED) lamp and, in particular, to forming a lamp with an array of LEDs, as a semi-transparent layer, positioned between a wavelength-conversion layer and a light exit window of the lamp.

BACKGROUND

It is common to provide LEDs, such as blue-emitting GaN LEDs, on a substrate and apply a yellow phosphor (e.g., YAG phosphor) over the LEDs to create white light. Any color lamp may be formed using LEDs and phosphors. The phosphor may be applied over each LED die, or the phosphor may be applied as a continuous layer over a layer of LEDs. In all such cases, the phosphor is located between the LEDs and the light exit surface of the lamp.

Phosphor is relatively expensive, and a minimum of phosphor should be used to accomplish its wavelength-conversion function to create the desired output color. A phosphor layer may be formed of phosphor powder in a transparent binder, or the phosphor powder may be directly applied over the LED surface, such as by electrophoresis.

When the phosphor is located between the LEDs and the light exit window of the lamp, some LED light typically leaks through the phosphor, and the combination of the LED light and the phosphor light creates the desired color. The phosphor layer must be of a thickness and density so that there is a precise percentage of the LED light that gets converted and a precise percentage that leaks through.

For lamps using a continuous layer of phosphor over a layer of LEDs, the phosphor area directly over a blue LED will appear blue due to the high concentration of blue light directly beneath it. This is referred to as a blue hot spot. The light will appear more yellowish, assuming a yellow phosphor is used, for areas further from the LED due to the lower concentration of blue light. This creates non-uniform color across the lamp.

In lamps where each LED is coated with a thin layer of phosphor, the lamp will have bright spots unless diffusing optics are used. Such optics attenuate the light, reducing efficiency.

In some cases, such as when the layer of LEDs is formed by printing many thousands of microscopic LEDs as a monolayer on a substrate, it is impractical to coat each LED with a layer of phosphor, and only a continuous layer of phosphor can be used.

What is needed is an LED lamp design that reduces the required amount of phosphor and improves color uniformity across the lamp.

SUMMARY

In one embodiment, a reflective substrate is provided. A specular film or a diffusing white layer may perform the reflection function. The substrate may be any size, such as one meter across to create a large light sheet.

A phosphor layer is then applied over the reflective substrate. The phosphor layer may be phosphor powder in a binder that is printed on the substrate or applied by other techniques. The phosphor layer should have substantially uniform thickness. It is assumed that the phosphor layer is a yellow YAG phosphor in a clear binder. The YAG phosphor may be combined with other phosphors for the purpose of adjusting, for example, the lamp's coordinated color temperature.

Over the phosphor layer is deposited a transparent conductor layer. Optionally, an optical stand-off layer may be printed between the phosphor layer and the transparent conductor layer with a thickness at least as thick as the LEDs are wide in order to reduce the amount of light down-shifted by the phosphor that re-enters the LED where it is likely to be absorbed. This can significantly increase lamp efficiency.

Over the transparent conductor layer is printed a monolayer of LEDs, using an LED ink containing microscopic LED dies, a solvent, and a resin for viscosity control. It is assumed that the LEDs emit blue light. The LEDs may be oriented in the same way over the transparent conductor layer by designing the LEDs to have a tall top electrode, or by other designs, where fluid dynamics cause the LEDs to orient in the same way. In one example, the LED anodes are facing up, and the cathodes are in ohmic contact with the transparent conductor layer. A reflective metal layer covers the entire top anode surface of the LEDs, so all light exiting the LEDs is either directed downward into the phosphor layer or directed sideways to scatter and mix the blue light. The anode semiconductor surface of the LEDs may be roughened prior to metallization to scatter the LED light that is reflected off the reflective metal layer on the anode surface.

A transparent dielectric is deposited between the LEDs, and another transparent conductor layer is deposited over the LEDs to make ohmic contact with the tall anode electrode. The two conductor layers thus connect the layer of LEDs in parallel. A thin light sheet is thus produced.

A potential is applied across the two transparent conductor layers to illuminate the LEDs. The blue light spreads out, and the downward blue light enters the underlying phosphor layer. The phosphor layer emits yellow light, which is combined with the blue light to form white light. Phosphor light that is emitted toward the substrate is reflected back through the phosphor layer and out the light exit surface of the lamp. Any blue light that leaks through the phosphor layer is also reflected back up into the phosphor layer and has a second chance of being converted.

Since the blue light from the LEDs spreads before exiting the lamp, and the top surface of the LEDs is obscured by the reflective metal layer over each LED, the blue hot spots over the LEDs are mitigated, and the color is more uniform. Further, since the blue light leaking through the phosphor layer is recycled, less phosphor needs to be used for the required conversion. Further, the phosphor light directed toward the reflective substrate is reflected back up and out of the lamp, further diffusing the light for improved color uniformity.

For improving the color uniformity even further, the phosphor layer may be made relatively thick, by increasing the percentage of the binder, so that the added distance between the LEDs and the reflective substrate mitigates hot spots even more. Instead, there may be a transparent stand-off layer that separates the LED layer from the phosphor layer. Further, by separating the LEDs from the reflective substrate and the phosphor layer, less light will impinge upon the LEDs and be absorbed by the LEDs. By providing a diffusive reflector layer over the substrate, the reflected light is diffused even more to further improve color uniformity and efficiency.

In another embodiment, the substrate is transparent, the LEDs have a reflective bottom electrode that covers the entire bottom surface of the LEDs, the top electrode is small to allow light to exit, the phosphor layer is formed over the top of the LED layer, and a reflector is formed over the phosphor layer. Since the space between the LEDs is transparent, and the conductor layers are transparent, all light will exit through the substrate.

The results are similar to those of the first embodiment. In both embodiments, the LED layer is between the phosphor layer and the light exit window of the lamp, and a reflector is provided on the other side of the phosphor layer.

The LEDs and conductor layers may be formed as strips containing parallel-connected LEDs, and different strips can be interconnected by a metal pattern on the substrate to be in any combination of series and parallel to achieve the desired electrical characteristics.

Quantum dots, dyes, or other wavelength-conversion materials may be used instead of phosphor.

Other embodiments are disclosed.

BRIEF DESCRIPTION OF THE DRAWINGS

FIG. 4A is taken across a horizontally bisected FIG. 4B.

Elements that are similar or identical in the various figures are labeled with the same numeral.

DETAILED DESCRIPTION

The GaN-based micro-LEDs used in embodiments of the present invention are less than a third the diameter of a human hair and less than a tenth as high, rendering them essentially invisible to the naked eye when the LEDs are sparsely spread across a substrate to be illuminated. This attribute permits construction of a nearly or partially transparent light-generating layer made with micro-LEDs. The number of micro-LED devices per unit area may be freely adjusted when applying the micro-LEDs to the substrate. A well dispersed random distribution across the surface can produce nearly any desirable surface brightness. Lamps well in excess of 10,000 cd/m$^2$ have been demonstrated by the assignee. The LEDs may be printed as an ink using screen printing or other forms of printing. Further detail of forming a light source by printing microscopic vertical LEDs, and controlling their orientation on a substrate, can be found in US application publication US 2012/0164796, entitled, Method of Manufacturing a Printable Composition of Liquid or Gel Suspension of Diodes, assigned to the present assignee and incorporated herein by reference.

Figure 1:
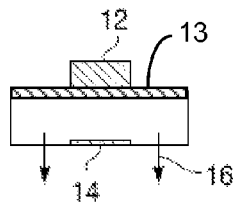
FIG. 1 is a simplified cross-section of a vertical LED designed to only emit light from its bottom surface and side surfaces.

FIG. 1 is a cross-sectional view of a vertical LED 10 (VLED) that may be used in the invention. The LED 10 includes standard semiconductor GaN layers, including an n-layer, and active layer, and a p-layer.

In one embodiment, an LED wafer, containing many thousands of vertical LEDs, is fabricated so that the top metal anode electrode 12 for each LED includes a reflective layer 13 (a mirror) over the top anode surface of the LED 10. The reflective layer 13 should have a reflectivity of over 90% for visible light. The bottom metal cathode electrode 14 for each LED, also reflective, is small to allow almost all the LED light to escape the cathode side. There is some side light, depending on the thickness of the LED. The anode and cathode surfaces may be opposite to those shown.

The LEDs are completely formed on the wafer, including the anode and cathode metallizations, by using one or more carrier wafers during the processing and removing the growth substrate to gain access to both LED surfaces for metallization. After the LEDs are formed on the wafer, trenches are photolithographically defined and etched in the front surface of the wafer around each LED, to a depth equal to the bottom electrode, so that each LED has a diameter of less than 50 microns and a thickness of about 4-8 microns, making them essentially invisible to the naked eye. A preferred shape of each LED is hexagonal. The trench etch exposes the underlying wafer bonding adhesive. The bonding adhesive is then dissolved in a solution to release the LEDs from the carrier wafer. Singulation may instead be performed by thinning the back surface of the wafer until the LEDs are singulated. The LEDs of FIG. 1 or FIG. 2 result, depending on the metallization designs. The microscopic LEDs are then uniformly infused in a solvent, including a viscosity-modifying polymer resin, to form an LED ink for printing, such as screen printing, or flexographic printing.

The LEDs may instead be formed using many other techniques and may be much larger or smaller. The lamps described herein may be constructed by techniques other than printing.

In FIG. 1, the bottom electrode 14 only uses up about 10% to 30% of the surface area of the LED 10. Even coverage up to 50% is adequate due to the reflectiveness of the reflective layer 13 and the electrode 14. A transparent conductor layer over the cathode semiconductor surface may be used to spread current from the cathode electrode 14.

Since there is no blockage of light around the electrode 14, and the active layer emits light in both directions, light rays 16 are emitted primarily from the bottom surface of the bare LED 10. Optionally, the bottom electrode 14 may be completely omitted and replaced with a transparent conductor, such as ITO.

The surfaces of the LED 10 may be roughened by etching to increase light extraction (i.e., decrease internal reflections).

If it is desired for the anode electrodes 12 to be oriented in a direction opposite to the substrate after printing, the electrodes 12 are made tall so that the LEDs 10 are rotated in the solvent, by fluid pressure, as they settle on the substrate surface. The LEDs rotate to an orientation of least resistance. Over 90% like orientation has been achieved, although satisfactory performance may be achieved with over 75% of the LEDs being in the same orientation.

Figure 2:
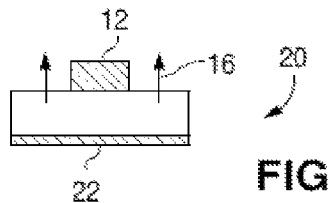
FIG. 2 is a simplified cross-section of a vertical LED designed to only emit light from its top surface and side surfaces.

The LED 20 of FIG. 2 is identical to the LED 10 except a reflective cathode electrode 22 extends over the entire bottom surface of the LED 20. The light rays 16 thus exit through the anode side. The LEDs 10 are used in the embodiment of FIGS. 4A and 5, and the LEDs 20 are used in the embodiment of FIG. 6.

Figure 3:
FIG. 3 is a cross-sectional view of a starting substrate having a reflective layer and a phosphor layer over the reflective layer.

In FIG. 3, a starting substrate 26 is provided. The substrate 26 may be opaque, transparent, or semi-transparent and is preferably thin for light weight, low cost, and ease of processing. The substrate 26 may be a suitable polymer, such as polycarbonate, PMMA, or PET, and may be dispensed from a roll. The substrate 26 may even be a coated paper or cloth. The substrate 26 can be any size, such as one square meter across, since no vacuum processing is needed for fabrication of the lamp and the processing may be performed using a conveyor system.

A reflector layer 28 is deposited on the substrate 28 such as by printing. Alternatively, the substrate 26 itself is reflective, obviating the need for the reflective layer 28. The reflector layer 28 may be a specular film, such as a reflective metal, or may be a diffusing white layer.

A phosphor layer 30 is deposited, such as by screen printing, over the reflector layer 28. If the LEDs 10 emit blue light, the phosphor layer 30 may be a combination of YAG (yellow) phosphor and red phosphor in a polymer binder to create white light, where the red phosphor creates a warmer white light. Any colors can be created by other combinations of phosphors. Other wavelength-conversion materials may be used instead, such as quantum dots or dyes.

An optional transparent stand-off layer may be formed that separates the LED layer from the phosphor layer 30. By separating the LEDs from the reflective surface and the phosphor layer 30, less light will impinge upon the LEDs and be absorbed by the LEDs.

Figure 4A:
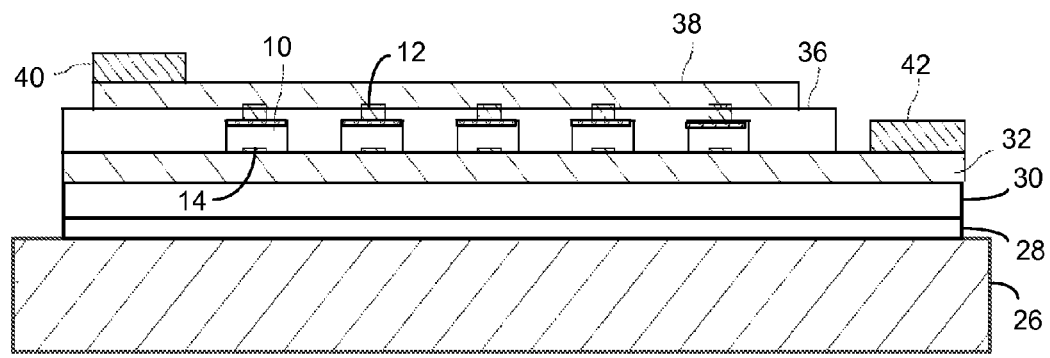
FIG. 4A is a cross-sectional view of one embodiment of the inventive lamp where light exits a surface opposite to the substrate.

As shown in FIG. 4A, on top of the phosphor layer 30 (or stand-off layer) is deposited a transparent conductor layer 32, such as an indium-tin-oxide (ITO) layer or a layer containing silver nanofibers. The conductor layer 32 may have a conductivity of 1 to 100 ohms/square, which is adequate for short spans with a low current. If the resistivity is too high due to the width of the light sheet, thin metal runners may be printed across the width and connected to one or more perpendicular metal bus bars to create a more uniform voltage across the conductor layer 32.

The LEDs 10 are then printed on the conductor layer 32 such as by screen printing with a suitable mesh to allow the LEDs to pass through and control the thickness of the layer. Because of the comparatively low concentration, the LEDs 10 will be printed as a monolayer and be fairly uniformly distributed over the conductor layer 32. Any other suitable deposition process may be used. In the example of FIG. 4A, the top anode electrodes 12 are formed to be relatively tall so that the LEDs 10 orient themselves in the direction shown in FIG. 4A by taking the rotational orientation of least resistance when settling on the surface of the conductor layer 32. By proper construction of the top electrode, over 90% of the LEDs 10 can be oriented with their anodes up.

The solvent is then evaporated by heat using, for example, an infrared oven. After curing, the LEDs 10 remain attached to the underlying transparent conductor layer 32 with a small amount of residual resin that was dissolved in the LED ink as a viscosity modifier. The adhesive properties of the resin and the decrease in volume of resin underneath the LEDs 10 during curing press the bottom LED electrode 14 against the underlying transparent conductor 32, making ohmic contact with it.

A dielectric layer 36 is then selectively printed over the surface to encapsulate the LEDs 10 and secure them in position without covering at least one edge of the conductor layer 32. The ink used in the dielectric layer 36 is designed to pull back from the upper surface of the LEDs 10 during curing to expose the top anode electrodes 12.

A top transparent conductor layer 38 is then printed over the dielectric layer 36 to electrically contact the electrodes 12 and cured in an oven appropriate for the type of transparent conductor being used.

Metal bus bars 40 and 42 are then screen printed along opposite edges of the transparent conductor layers 38 and 32 and electrically terminate at anode and cathode leads (not shown), respectively, for the light sheet. If the bus bar ink is solvent based, it may be cured in an oven. If it is a radiation cured silver, it may be cured by exposing it to a UV light or electron beam curing system. The bus bars 40/42 will ultimately be connected to a positive or negative driving voltage.

The points of connection between the bus bars 40/42 and the driving voltage leads may be at opposite corners of each bus bar 40/42 for uniform current distribution along each bus bar 40/42 or may be at multiple points along each bus bar 40/42 to reduce the voltage drop across the bus bar 40/42, for large light sheets, to improve electrical efficiency.

If a suitable voltage differential is applied to the anode and cathode leads, all the LEDs 10 with the proper orientation will be illuminated.

As the light sheet width is increased, the voltage differential near the middle of the transparent conductor layers 32 and 38 will be lessened due to the resistivity of the conductor layers. As a result, the middle LEDs 10 may not be as bright as the LEDs nearer the edge.

Figure 4B:
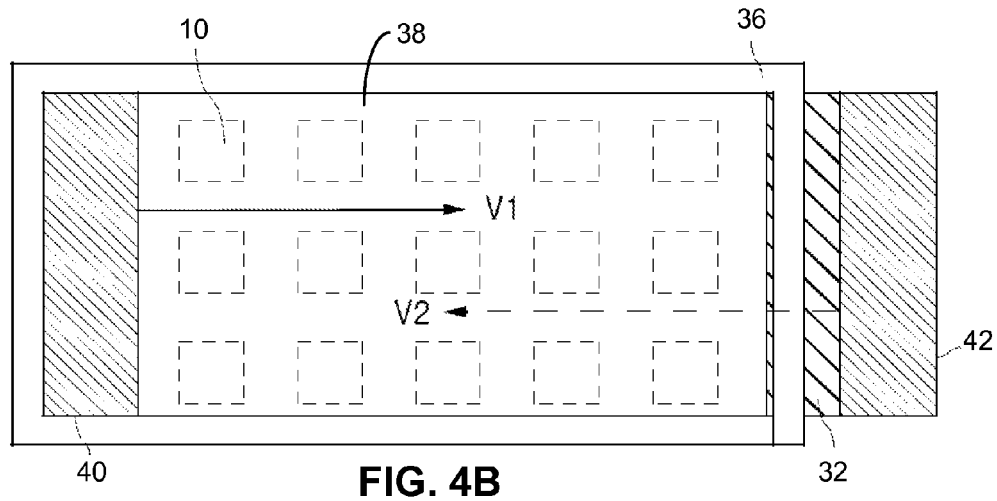
FIG. 4B is a top down view of the structure of FIG. 4A, where

The configuration of the bus bars 40/42 in FIGS. 4A and 4B compensates for such resistivity in the conductor layers 32/38. One metal bus bar 40 is formed along only one edge of the top transparent conductor layer 38, and another metal bus bar 42 is formed along one edge of the bottom transparent conductor layer 32.

FIG. 4B shows how the voltage V1 applied to the bus bar 40 spreads across the top conductor layer 38 and the voltage V2 applied to the bus bar 42 spreads across the bottom conductor layer 32. If we assume the voltage applied to the bus bar 40 is +3V and the voltage applied to the bus bar 42 is −3V, the voltage along the top conductor layer 38 will be reduced to, for example, +2V at the opposite end of the conductor layer 38 due to Ohms law. Similarly, the voltage along the bottom conductor layer 32 will approach ground and be, for example, −2V at the opposite end of the conductor layer 32 due to Ohms law. Along the length of the conductor layers 32/38, however, the differential voltage normal to the layers will be a constant 5 V, sufficient to turn on the LEDs 10, because of the 2 to 3 orders of magnitude lower resistance of the bus bars 40 and 42 relative to the conductor layers 38 and 32 The voltages will be controlled by a current regulator. As long as there is both a much lower resistance in bus bars 40 and 42 relative to the transparent conductor layers 38 and 32 and the transparent conductor layers 38 and 32 have matching impedances, uniform current density and therefore LED brightness can be maintained across the entire surface of the lamp.

In another embodiment, not shown, an equal potential is supplied over both conductor layers 38/32 by horizontal metal runners (e.g., traces) along each of the conductor layers 38/32. The metal runners on the conductor layers 38/32 should not overlie each other, and the runners on the conductor layer 38 should be widely laterally spaced from the runners on the conductor layer 32 to achieve a substantially constant voltage differential at all points between the conductor layers 38/32. Optionally, a bus bar may be formed along both edges of each conductor layer and connected to the anode or cathode lead for even more uniform potential in embodiments where the light sheet is large and there are high currents conducted.

Figure 5:
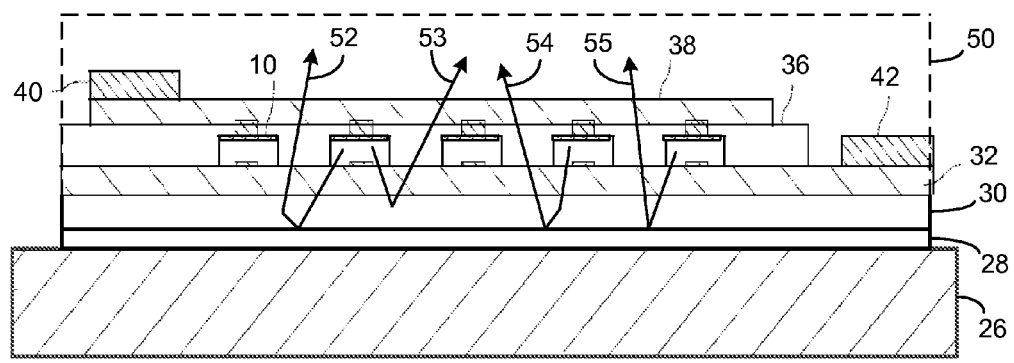
FIG. 5 illustrates the lamp of FIG. 4A showing various light rays.

FIG. 5 illustrates the light sheet lamp of FIG. 4A showing the different paths of various possible light rays. FIG. 5 also shows an optional protective transparent layer 50 over the structure for protection and increased light extraction. The LEDs 10 are shown much larger relative to the remaining structures then they would be in an actual embodiment for ease of understanding and are shown much closer together than they would be in an actual embodiment.

The light ray 52 exits the bottom of the LED 10, passes through the phosphor layer 30 unabsorbed, and reflects off the reflector layer 28. On the way back through the phosphor layer 30, the light ray 52 is absorbed by a phosphor particle and converted to the phosphor wavelength, such as yellow. Therefore, the LED light has an increased probability of being converted by the phosphor layer 30. Thus, less phosphor is needed, relative to a lamp with phosphor between the viewer and the LEDs, in order to achieve a given color temperature.

The light ray 53 exits the bottom of the LED 10 and is directly absorbed by a phosphor particle and converted to the phosphor wavelength. The phosphor particle happens to emit the light in the direction of the exit window of the lamp.

The light ray 54 exits the bottom of the LED 10 and is directly absorbed by a phosphor particle and converted to the phosphor wavelength. The phosphor particle happens to emit the light in the direction of the reflector layer 28. The reflector layer 28 then reflects the light out of the lamp.

The light ray 55 exits the bottom of the LED 10, passes through the phosphor layer 30 unabsorbed, and reflects off the reflector layer 28. On the way back through the phosphor layer 30, the light ray 55 again passes through the phosphor layer 30 unabsorbed and exits the lamp as blue light.

The blue light exiting the sidewalls of the LEDs 10 exits the lamp without conversion or gets converted by the phosphor layer 30. Such light is widely dispersed throughout the lamp and helps to create a more uniform color across the lamp.

Since there is no blue light directly emitted from the top surfaces of the LEDs 10, there are no blue hot spots perceivable, improving color uniformity.

To further increase color uniformity and efficiency, a transparent spacer layer (also referred to as a stand-off layer) may be deposited between the transparent conductor layer 32 and the phosphor layer 30. The spacer layer can be from 10 microns thick to hundreds of microns thick. This allows the LED light to be more widely diffused prior to energizing the phosphor layer 30 or reflecting off the reflector layer 28, resulting in even better color uniformity across the lamp. Further, by separating the LEDs from the phosphor layer and reflector layer, there is less probability that a reflected or re-emitted light ray will be absorbed by the nearest LED, increasing the efficiency of the lamp. Alternatively, the phosphor layer 30 may be made thicker by adding more binder.

Further, by making the reflector layer 28 diffusively reflective, such as a white layer, the reflected light will be redirected away from the nearest LED and not be absorbed by the LED.

In another embodiment, to additionally control the amount of blue light, some LEDs may be intentionally oriented in an opposite direction as shown in FIG. 5 so that the blue light is directly emitted toward the exit window when those LEDs are turned on. Those LEDs may be turned on by alternating the polarity of the driving voltage. The relative duty cycle of each polarity can be easily and dynamically controlled to select a precise amount of blue light that will be combined with the phosphor light. The blue light content may even be adjusted over the course of a day. Since those opposite LEDs may only be illuminated at a low duty cycle, their overall effective brightness is low and they will not result in perceptible blue hot spots.

The phosphor layer 30 may be replaced by other wavelength-conversion materials such as quantum dots or dyes.

Figure 6:
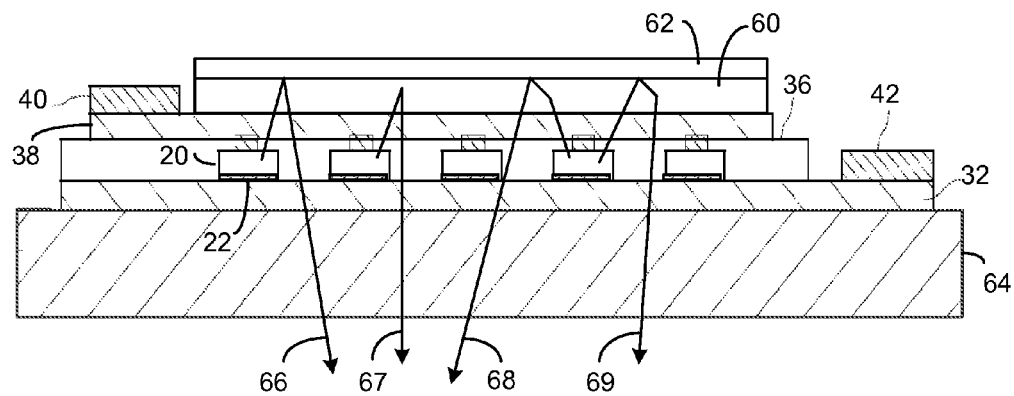
FIG. 6 is a cross-sectional view of another embodiment of the inventive lamp where the phosphor layer overlies the LED layer and light exits through the transparent substrate.

FIG. 6 illustrates a lamp where the LEDs 20 from FIG. 2 are used, and the orientation of the LEDs 20 is the same as in FIG. 5. In FIG. 6, the LEDs 10 primarily emit their blue light upward. Therefore, the phosphor layer 60 is overlying the top transparent conductor layer 38, and the reflector layer 62 overlies the phosphor layer 60. The reflector layer 62 may be specular or diffusive, such as white. The substrate 64 is transparent to allow the LED light and phosphor light to pass. The transmissivity should be greater than 90%. The remaining layers and the various alternatives may be the same as those described above.

In FIG. 6, the light ray 66 exits the top of the LED 20, passes through the phosphor layer 60 unabsorbed, and reflects off the reflector layer 62. On the way back through the phosphor layer 60, the light ray 66 again passes through the phosphor layer 60 unabsorbed and exits the lamp as blue light.

The light ray 67 exits the top of the LED 20 and is directly absorbed by a phosphor particle and converted to the phosphor wavelength. The phosphor particle happens to emit the light in the direction of the exit window of the lamp.

The light ray 68 exits the top of the LED 20 and is directly absorbed by a phosphor particle and converted to the phosphor wavelength. The phosphor particle happens to emit the light in the direction of the reflector layer 62. The reflector layer 62 then reflects the light out of the lamp.

The light ray 69 exits the top of the LED 20, passes through the phosphor layer 60 unabsorbed, and reflects off the reflector layer 62. On the way back through the phosphor layer 60, the light ray 69 is absorbed by a phosphor particle and converted to the phosphor wavelength. Therefore, the LED light has an increased probability of being converted by the phosphor layer 60. Thus, less phosphor is needed, relative to a lamp with phosphor between the viewer and the LEDs, in order to achieve a given color temperature.

The lamp of FIG. 6 has the same beneficial attributes as the lamp of FIG. 5, where color uniformity is improved and less phosphor is needed.

The various figures may represent the entire lamp or just a small, repeated section of the lamp. In one embodiment, the LEDs and conductors are printed as strips over the substrate. The LEDs in a single strip are connected in parallel by the conductors. A pattern of conductors between the strips can then connect the strips in any combination of series and parallel to achieve the desired electrical characteristics.

Additional layers of VLEDs may be stacked, with a transparent conductor in-between, to form VLEDs connected in a combination of series and parallel.

All layers of the light sheet lamps may be formed by printing in atmospheric conditions with simple equipment and without any precision alignment and pick-and-place mechanisms. The light sheet is flexible without any danger of delamination when flexed and is very thin and light.

The light sheet may be supported by a simple frame and hung from a ceiling or used in other ways. The light sheet can even be bent, such as in a U-shape or a V-shape to contour to curved walls or to create various emission profiles. The light sheet may also be laminated on other surfaces, including windows, or be patterned to create alpha-numeric signs or other displays.

Diffusion layers or brightness enhancement layers may be printed on or laminated on the light sheet exit surface to modify the light emission pattern and avoid glare. Similarly, the substrate 64 (FIG. 6) itself can be designed to have certain optical properties.

The substrate 26/64 may be provided with a release layer to allow the remaining layers to be removed from the substrate 26/64, creating a more efficient light sheet having a thickness of only 20-80 microns. Such a light sheet is extremely flexible and even foldable and may be adhered to another type of substrate, including a fabric for clothing.

The light sheets can be used for general illumination, displays, backlights, indicator lights, etc.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An illumination structure having a light exit surface, the structure comprising:
    a substrate;
    a transparent first conductor layer overlying the substrate;
    an array of vertical light emitting diodes (VLEDs), the VLEDs having a bottom electrode electrically contacting the first conductor layer, the VLEDs having a first surface covered with a reflective material such that a majority of all light emitted by the VLEDs is emitted through a second surface, opposite the first surface, wherein the first surface faces the light exit surface of the illumination structure;
    a transparent second conductor layer overlying the VLEDs, the VLEDs having a top electrode electrically contacting the second conductor layer;
    the VLEDs being illuminated by a voltage differential between the first conductor layer and the second conductor layer such that light passes through the first conductor layer and the second conductor layer;
    a wavelength-conversion layer having a third surface facing the second surface of the VLEDs, the wavelength-conversion layer having a fourth surface opposite the third surface; and
    a reflector layer opposing the fourth surface of the wavelength-conversion layer, such that the wavelength-conversion layer is between the array of VLEDs and the reflector layer,
    wherein at least some light emitted from the second surface of the VLEDs and some of the light emitted from the wavelength-conversion layer is reflected by the reflector layer to reenter the wavelength-conversion layer and ultimately exit through the light exit surface.

2. The structure of claim 1 wherein the wavelength-conversion layer and reflector layer are between the array of VLEDs and the substrate.

3. The structure of claim 1 wherein a surface of the substrate is the light exit surface of the illumination structure, and wherein the array of VLEDs is between the wavelength-conversion layer and the substrate.

4. The structure of claim 1 wherein the VLEDs comprise microscopic VLEDs printed as an ink over the first conductor layer.

5. The structure of claim 4 wherein greater than 75% of the VLEDs printed are in the same orientation with respect to the first conductor layer and the second conductor layer, and wherein the VLEDs with the desired orientation comprises the array of VLEDs.

6. The structure of claim 1 wherein the VLEDs are connected in parallel by the first conductor layer and the second conductor layer.

7. The structure of claim 1 wherein the reflective material covering the first surface is a metal and forms part of the bottom electrode.

8. The structure of claim 1 wherein the reflective material covering the first surface is a metal and forms part of the top electrode.

9. The structure of claim 1 wherein the first surface covered by the reflective material is a cathode of the VLEDs.

10. The structure of claim 1 wherein the first surface covered by the reflective material is an anode of the VLEDs.

11. The structure of claim 1 further comprising one or more conductive first bus bars contacting one or more edges of the first conductor layer, and one or more conductive second bus bars contacting one or more edges of the second conductor layer.

12. The structure of claim 1 wherein the wavelength-conversion layer comprises at least one phosphor.

13. The structure of claim 1 wherein the wavelength-conversion layer comprises quantum dots.

14. The structure of claim 1 wherein the structure is flexible.

15. The structure of claim 1 wherein the VLEDs emit blue light, and light emitted by the wavelength-conversion layer combines with the blue light to create white light.

16. The structure of claim 1 wherein the reflector layer is specular.

17. The structure of claim 1 wherein the reflector layer diffuses impinging light.

18. The structure of claim 1 further comprising a transparent spacer layer between the array of VLEDs and the wavelength-conversion layer.

* * * * *